(12) United States Patent
Hsieh (10) Patent No.: US 12,387,076 B2
(45) Date of Patent: Aug. 12, 2025

(54) RFID TAG WITH TWIN IC DESIGN FOR GENERATING OMNIDIRECTIONAL RADIATION PATTERN WITHOUT NULL

(71) Applicant: Onecent Technology (Singapore) Pte. Ltd., Singapore (SG)

(72) Inventor: Jiann-Shin Hsieh, Singapore (SG)

(73) Assignee: Onecent Technology (Singapore) Pte. Ltd., Singapore (SG)

( * ) Notice: Subject to any disclaimer, the term of this patent is extended or adjusted under 35 U.S.C. 154(b) by 71 days.

(21) Appl. No.: 18/112,516

(22) Filed: Feb. 22, 2023

(65) Prior Publication Data

US 2023/0274118 A1   Aug. 31, 2023

Related U.S. Application Data

(60) Provisional application No. 63/313,730, filed on Feb. 25, 2022.

(51) Int. Cl.
| | | |
|---|---|---|
| G06K 19/07 | (2006.01) | |
| H01L 23/00 | (2006.01) | |
| H01L 23/48 | (2006.01) | |
| H01Q 1/22 | (2006.01) | |

(52) U.S. Cl.
CPC .......... *G06K 19/0723* (2013.01); *H01L 23/48* (2013.01); *H01L 23/564* (2013.01); *H01Q 1/2225* (2013.01)

(58) Field of Classification Search
CPC .... G06K 19/0723; H01L 23/48; H01L 23/564
USPC .......................................................... 235/492
See application file for complete search history.

(56) References Cited

U.S. PATENT DOCUMENTS

| | | | | |
|---|---|---|---|---|
| 2007/0229228 | A1* | 10/2007 | Yamazaki | G06K 19/0701 340/572.1 |
| 2014/0027906 | A1* | 1/2014 | Narita | H01L 24/48 257/784 |
| 2019/0294943 | A1* | 9/2019 | Ng | G06K 19/0723 |
| 2022/0222504 | A1* | 7/2022 | Ambre | G06K 19/07773 |

FOREIGN PATENT DOCUMENTS

FR       2915011 A1 * 10/2008 ............. G06K 19/07

\* cited by examiner

*Primary Examiner* — Michael G Lee
*Assistant Examiner* — David Tardif
(74) *Attorney, Agent, or Firm* — NZ Carr Law Office (57) ABSTRACT

A RFID tag that includes a first RF chip, a second RF chip, a first wiring and a second wiring is provided. The first RF chip and the second RF chip are adjacent and connected to each other, and each of the first RF chip and the second RF chip has two pads. Said two pads of the first RF chip and said two pads of the second RF chip are connected to two complementary antennas. The first wiring conducts said two pads of the first RF chip to one of said two complementary antennas. The second wiring conducts said two pads of the second RF chip to the other of said two complementary antennas.

20 Claims, 5 Drawing Sheets

RFID TAG WITH TWIN IC DESIGN FOR GENERATING OMNIDIRECTIONAL RADIATION PATTERN WITHOUT NULL

FIELD OF THE INVENTION

The invention relates to the design of a radio frequency identification tag (RFID tag), and more particularly, to a RFID tag that has a novel design and reduced cost.

BACKGROUND OF THE INVENTION

In general, radio frequency identification (RFID) tags commonly seen on the market have four pads on a radio frequency (RF) chip to connect with a pair of antennas for generating an omnidirectional radiation pattern without a null. In other words, each antenna requires two pads to carry out the above technical effect. However, a cost of a RF chip with four pads might be higher than that of a RF chip with only two pads, while the current designs of the RF chip with two pads only generates a radiation pattern with a null when connected to a pair of antennas.

As the conventional solutions can only achieve an omnidirectional RF tag using a 4-pad RF chip which is not cost-effective, there is a need for a novel chip design (e.g. a two-pad chip based design) capable of reaching the null-free effect, with a lower cost or without the cost being significantly increased.

SUMMARY OF THE INVENTION

According to the above requirements, the objective of the present invention is to provide a novel chip design (i.e. a novel twin IC design) to solve the above problems.

An embodiment of the present invention provides a RFID tag that comprises first and second RF chips, a first wiring, and a second wiring. The first RF chip and the second RF chip are adjacent and connected to each other, and each of the first RF chip and the second RF chip has two pads. Said two pads of the first RF chip and said two pads of the second RF chip are connected to two complementary antennas. The first wiring conducts said two pads of the first RF chip to one of said two complementary antennas. The second wiring conducts said two pads of the second RF chip to the other of said two complementary antennas.

Another embodiment of the present invention provides a RFID tag that comprises first and second RF chips, a first wiring, a second wiring, and a proximity wiring. The first RF chip and the second RF chip are adjacent and connected to each other, and each of the first RF chip and the second RF chip has two pads. Said two pads of the first RF chip and said two pads of the second RF chip are connected to two complementary antennas. The first wiring conducts said two pads of the first RF chip. The second wiring conducts said two pads of the second RF chip. The proximity wiring is wirelessly connected to said two complementary antennas and approximates with the first wiring and the second wiring, wherein the proximity wiring is arranged to conduct said two pads of the first RF chip to one of said two complementary antennas, and conduct said two pads of the second RF chip to the other of said two complementary antennas.

Optionally, according to an embodiment of the present invention, the first RF chip and the second RF chip have a same product code.

Optionally, according to an embodiment of the present invention, the first RF chip and the second RF chip generate an omnidirectional radiation pattern without a null.

Optionally, according to an embodiment of the present invention, the RFID tag is operated under high frequency (HF) or above.

Optionally, according to an embodiment of the present invention, the RFID tag is operated under ultra-high frequency (UHF).

Optionally, according to an embodiment of the present invention, the first RF chip and the second RF chip are cut as a whole from a wafer.

Optionally, according to an embodiment of the present invention, the first RF chip and the second RF chip are horizontally connected to each other, and said two pads of the first RF chip and said two pads of the second RF chip form a 1×4 array (or another similar geometric pattern).

Optionally, according to an embodiment of the present invention, the first RF chip and the second RF chip are vertically connected to each other, and said two pads of the first RF chip and said two pads of the second RF chip form a 2×2 matrix (or another similar geometric pattern).

Optionally, according to an embodiment of the present invention, said two pads of the first RF chip are connected to two ports of one of said two complementary antennas.

Optionally, according to an embodiment of the present invention, said two pads of the second RF chip are connected to two ports of the other of said two complementary antennas.

To sum up, the present invention provides a "twin IC" (or Dual IC) structure, where two chips each having two pads are adjacent and connected each other. The cost of two chips with two pads, as widely known, are much cheaper than a chip with four pads. The antenna provided by the present invention can reach the desired omnidirectional radiation pattern without a null by using chips with two pads only, and is thus novel and reduces the cost by far.

DETAILED DESCRIPTION OF PREFERRED EMBODIMENTS

The present disclosure is particularly described by following examples that are mainly for illustrative purposes. For those who are familiar with the technologies, various modifications and embellishments can be made without departing from the spirit and scope of the present disclosure, and thus the scope of the present disclosure shall be subject to the content of the attached claims. In the entire specification and claims, unless clearly specified, terms such as "a/an" and "the" can be used to describe "one or at least one" assembly or component. In addition, unless the plural use is obviously excluded in the context, singular terms may also be used to present plural assemblies or components. Unless otherwise specified, the terms used in the entire specification and claims generally have the common meaning as those used in this field. Certain terms used to describe the disclosure will be discussed below or elsewhere in this specification, so as to provide additional guidance for practitioners. The examples throughout the entire specification as well as the terms discussed herein are only for illustrative purposes, and are not meant to limit the scope and meanings of the disclosure or any illustrative term. Similarly, the present disclosure is not limited to the embodiments provided in this specification.

The terms "substantially", "around", "about" or "approximately" used herein may generally mean that the error of a given value or range is within 20%, preferably within 10%. In addition, the quantity provided herein can be approximate, which means that unless otherwise stated, it can be expressed by the terms "about", "nearly", etc. When the quantity, concentration, or other values or parameters have a specified range, a preferred range, or upper and lower boundaries listed in the table, they shall be regarded as a particular disclosure of all possible combinations of ranges constructed by those upper and lower limits or ideal values, no matter such kind of ranges have been disclosed or not. For example, if the length of a disclosed range is X cm to Y cm, it should be regarded as that the length is H cm, and H can be any real number between x and y.

In addition, the term "electrical coupling" or "electrical connection" may include direct and indirect means of electrical connection. For example, if the first device is described as electrically coupled to the second device, it means that the first device can be directly connected to the second device, or indirectly connected to the second device through other devices or means of connection. In addition, if the transmission and provision of electric signals are described, those who are familiar with the art should understand that the transmission of electric signals may be accompanied by attenuation or other non-ideal changes. However, unless the source and receiver of the transmission of electric signals are specifically stated, they should be regarded as the same signal in essence. For example, if the electrical signal S is transmitted from the terminal A of the electronic circuit to the terminal B of the electronic circuit, which may cause voltage drop across the source and drain terminals of the transistor switch and/or possible stray capacitance, but the purpose of this design is to achieve some specific technical effects without deliberately using attenuation or other non-ideal changes during transmission, the electrical signals S at the terminal A and the terminal B of the electronic circuit should be substantially regarded as the same signal.

The terms "comprising", "having" and "involving" used herein are open-ended terms, which can mean "comprising but not limited to". In addition, the scope of any embodiment or claim of the present invention does not necessarily achieve all the purposes, advantages or features disclosed in the present invention. In addition, the abstract and title are only used to assist the search of patent documents, and are not used to limit the scope of claims of the present invention.

Figure 1:
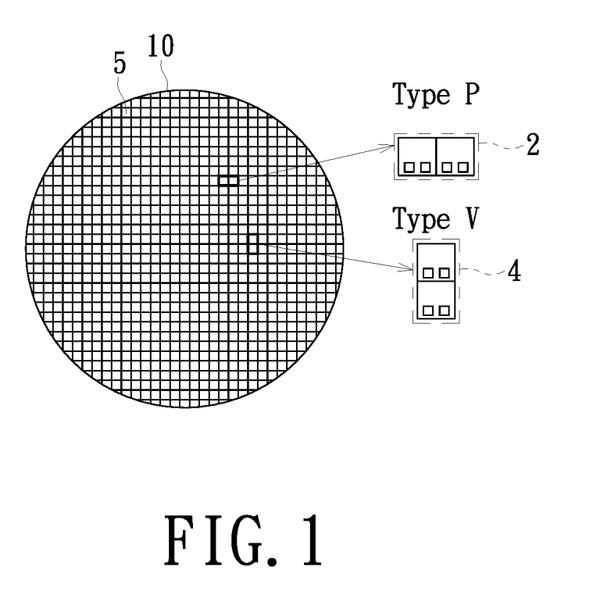
FIG. 1 is a diagram illustrating the manufacturing process of the RF tag of the present invention.

Please refer to FIG. 1, which is a diagram illustrating the manufacturing process of the RF tag of the present invention. As shown in FIG. 1, in a first scenario, the wafer 10 comprises many units, and each unit 5 can be cut therefrom as the material of a chip. In one aspect of the present invention, as shown by the chip set 2, two adjacent and chips are cut as a whole from the wafer 10 in a horizontal manner (marked as Type P), in which the two chips in the chip set 2 are connected without breaking apart. In the chip set 2, each chip has two connection pads (or conduction pads), hereafter "pads" for brevity, and the total four pads form a 1×4 array. In another aspect of the present invention, as shown by the chip set 4, two adjacent and chips are cut as a whole from the wafer 10 in a vertical manner (marked as Type V), in which the two chips in the chip set 2 are connected without breaking apart. In the chip set 4, each chip has two pads, and the total four pads form a 2×2 matrix. The more detailed embodiments of RF tags in Type P or Type V are illustrated in FIGS. 2-5.

Figure 2:
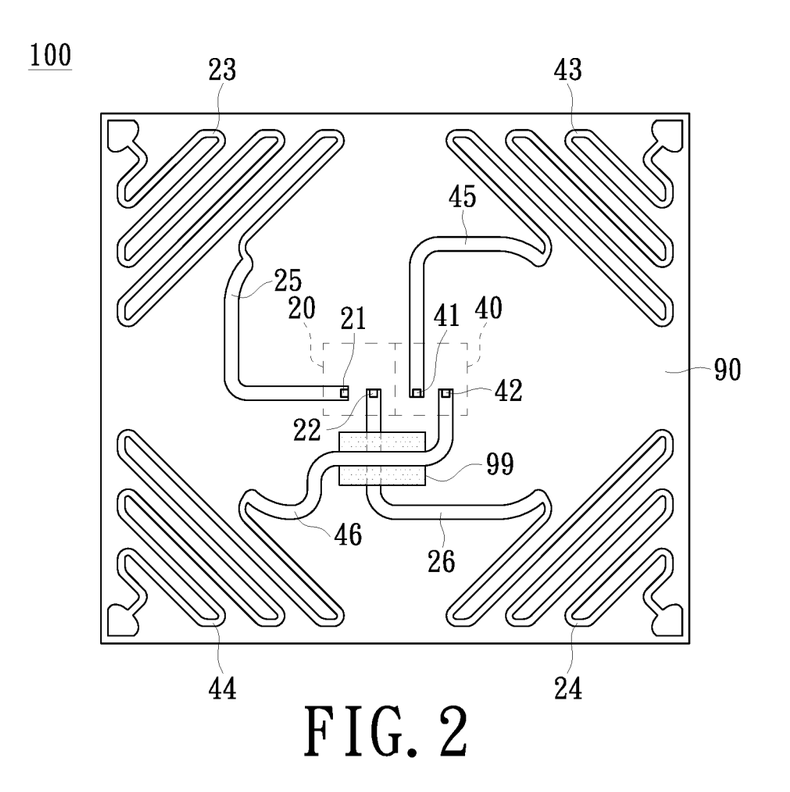
FIG. 2 is a diagram illustrating an RF tag according to an embodiment of the present invention.

Refer to FIG. 2, which is a diagram illustrating an RF tag 100 according to an embodiment of the present invention. As shown in FIG. 2, the RFID tag 100 comprises a sheet 90, a first RF chip 20 and a second RF chip 40, a first wiring (comprised of the wiring segments 23, 24, 25 and 26), and a second wiring (comprised of wiring segments 43, 44, 45 and 46). The sheet 90 functions as a platform or substrate of the above elements. The first RF chip 20 and the second RF chip 40 are adjacent and connected to each other. The first RF chip 20 comprises pads 21 and 22, the second RF chip 40 comprises pads 41 and 42. Two complementary antennas (not shown) are connected to the pads 21 and 22 of the first RF chip 20 and the pads 41 and 42 of the second RF chip 40 via the first wiring and the second wiring, respectively. Specifically, the wiring segments 23, 25 connect the pad 21 to one end of one antenna, and the wiring segments 24, 26 connect the pad 22 to the other end of said antenna. Similarly, the wiring segments 43, 45 connect the pad 41 to one end of the other antenna, and the wiring segments 44, 46 connect the pad 42 to the other end of said other antenna.

Note that in this design the dipoles of the antennas have to cross each other without shorting. As shown in FIG. 2, the wiring segment 46 crosses the wiring segment 26, that is, the wiring segment 46 hovers the wiring segment 26. In order to avoid the conduction of the wiring segment 46 and the wiring segment 26, an isolation sticker 99 (or strap) may be placed therebetween. In addition, the solation sticker 99 can be replaced by other materials that provide similar insulating effects. Through this wiring design in this embodiment, the differential pairs (i.e., the complementary antennas) may drive two cross polarized dipoles, that is, the dipoles to which the two loops are coupled are crossly polarized. Thus, under the design in this embodiment, the radiation pattern created by the union of two cross polarized dipoles has no null, and this is result is highly desirable in UHF tag designs to achieve the omnidirectional effects.

The first RF 20 chip and the second RF chip 40 of the RF tag 100 may have the same product code, so that the two RF chips can function as a single 4-pad RF chip, and generate an omnidirectional radiation pattern without a null.

In the design of RFID tag 100, the two antennas should both operate under the same frequency range, e.g. UHF. Although the present invention focuses on the utilization under UHF, the overall concept may be also applicable to other frequency range, e.g. HF.

Please note that the pattern and size of the wiring segment 25 and the second wiring are not particularly limited in the RF tag 100, as long as the wiring segment 25 and the second wiring are presented in a cross-coupling manner. In this embodiment, all the elements are on the same side of the sheet 90, but the altitude of the wiring segment 46 may be slightly higher than the rest of elements in order to cross the wiring segment 26 (or arranging the altitude of the wiring segment 26 to be higher than the wiring segment 46). In addition to the above means to prevent the shorting between the dipoles, other methods can also be adopted (such as the alternative presented in the embodiment of FIGS. 4A-4C).

Figure 3:
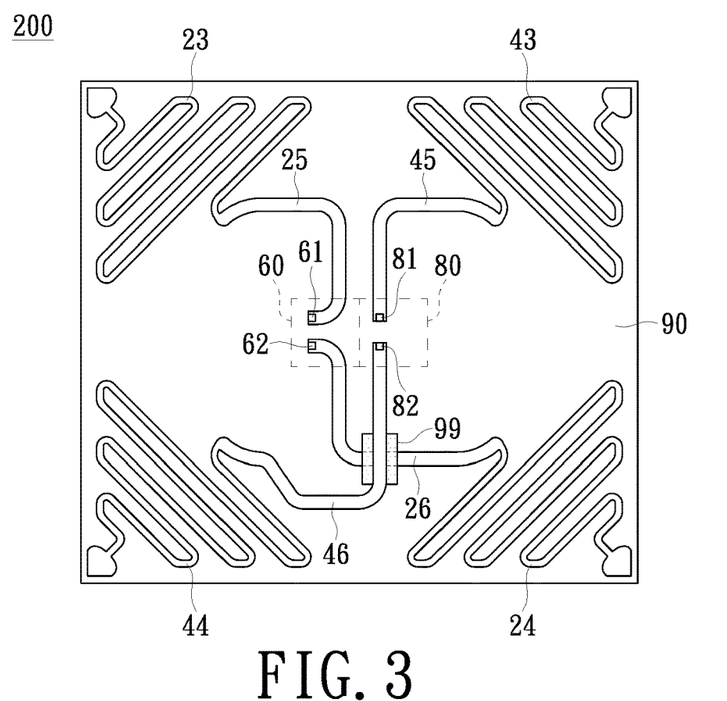
FIG. 3 is a diagram illustrating an RF tag according to another embodiment of the present invention.

Refer to FIG. 3, which is a diagram illustrating an RF tag 200 according to another embodiment of the present invention. As shown in FIG. 3, the difference between the RF tag 100 and the RF tag 200 is that the RF tag 200 is classified as the aforementioned Type V, where the first RF chip 60 and the second RF chip 80 are vertically connected to each other (although the connection between the first RF chip 60 and the second RF chip 80 appears to be horizontal, the vertical connection can be readily seen by rotating FIG. 3 for 90 degrees). The pads 61 and 62 of the first RF chip 60 and the pads 81 and 82 of the second RF chip 80 form a 2×2 matrix.

Specifically, in the RF tag 200, the first RF chip 60 and the second RF chip 80 are adjacent and connected to each other. The first RF chip 60 comprises pads 61 and 62, and the second RF chip 80 comprises pads 81 and 82. Two complementary antennas (not shown) are connected to the pads 61 and 62 of the first RF chip 60, and the pads 81 and 82 of the second RF chip 80 via the first wiring and the second wiring, respectively. Specifically, the wiring segments 23, 25 connect the pad 61 to one end of one antenna, and the wiring segments 24, 26 connect the pad 62 to the other end of said antenna. Similarly, the wiring segments 43, 45 connect the pad 81 to one end of the other antenna, and the wiring segments 44, 46 connect the pad 82 to the other end of said other antenna.

Similarly to the design in FIG. 2, the RF tag 200 in FIG. 3 place an isolation sticker 99 (of electrically insulating qualities) between the wiring segment 46 and the wiring segment 26, so as to avoid the shorting between the wiring segments. Further, all the elements are on the same side of the sheet 90, but the altitude of the wiring segment 46 may be slightly higher than the rest of elements in order to cross the wiring segment 26 (or arranging the altitude of the wiring segment 26 to be higher than the wiring segment 46). Through the above wiring design, the differential pairs (i.e., the complementary antennas) may drive two cross polarized dipoles, that is, the dipoles that the two loops are coupled to are cross polarized. Thus, under the design in this embodiment, the radiation pattern created by the union of two cross polarized dipoles has no null, and this is result is highly desirable in UHF tag designs.

Figure 5A:
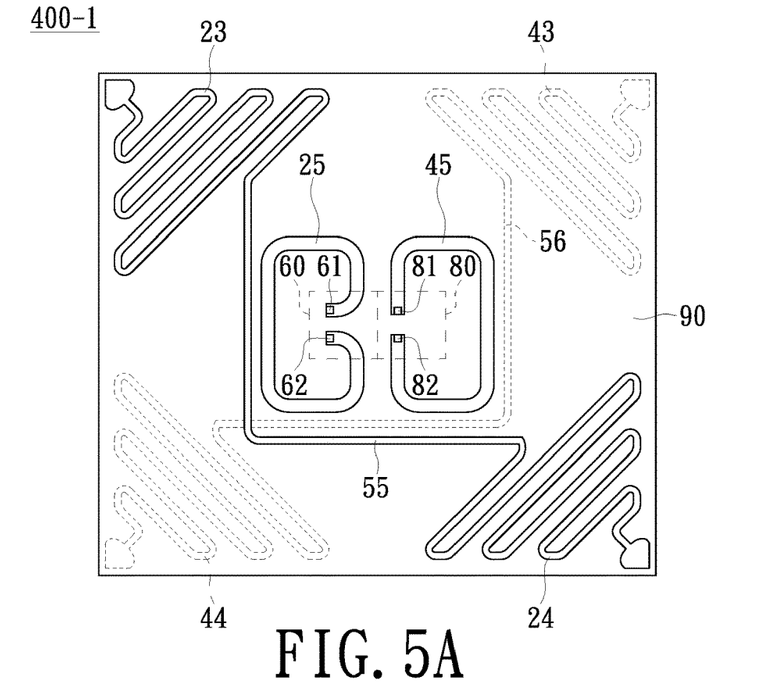
FIG. 5A is a diagram illustrating a modification based on the embodiment of FIG. 2.
Figure 5B:
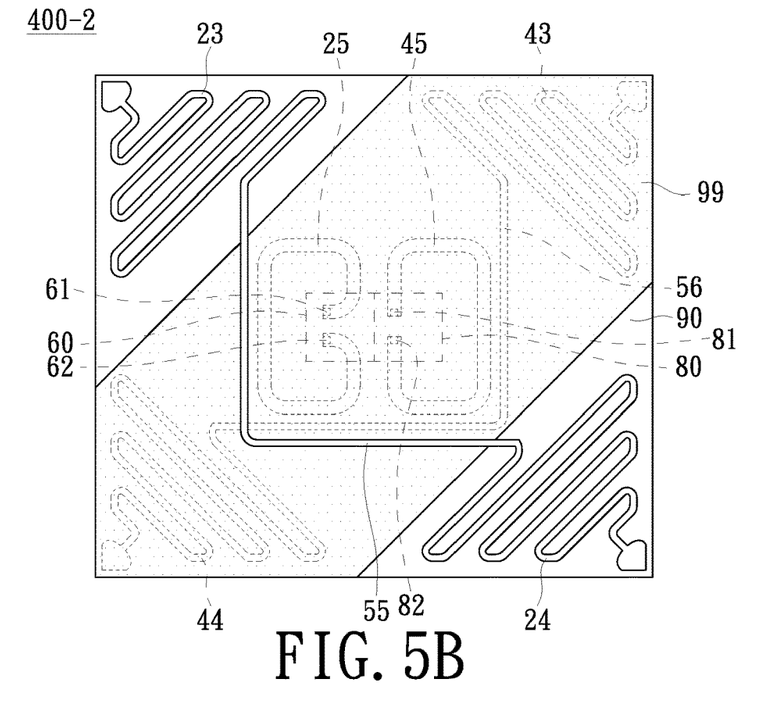
FIG. 5B is a diagram illustrating another modification based on the embodiment of FIG. 2.
Figure 5C:
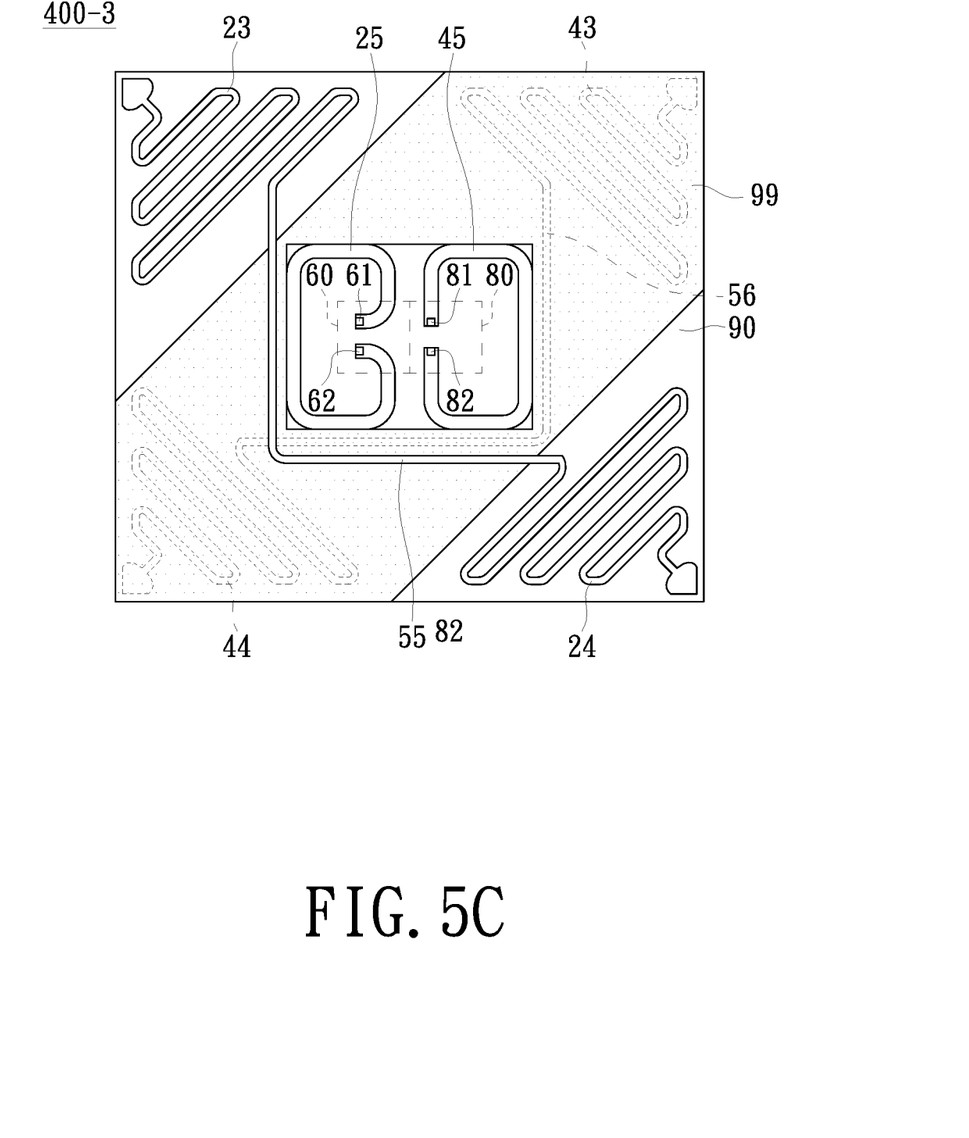
FIG. 5C is a diagram illustrating yet another modification based on the embodiment of FIG. 2.

In addition to the above means to prevent the shorting between the dipoles, other methods can also be adopted (such as the alternative presented in the embodiment of FIGS. 5A-5C).

Figure 4A:
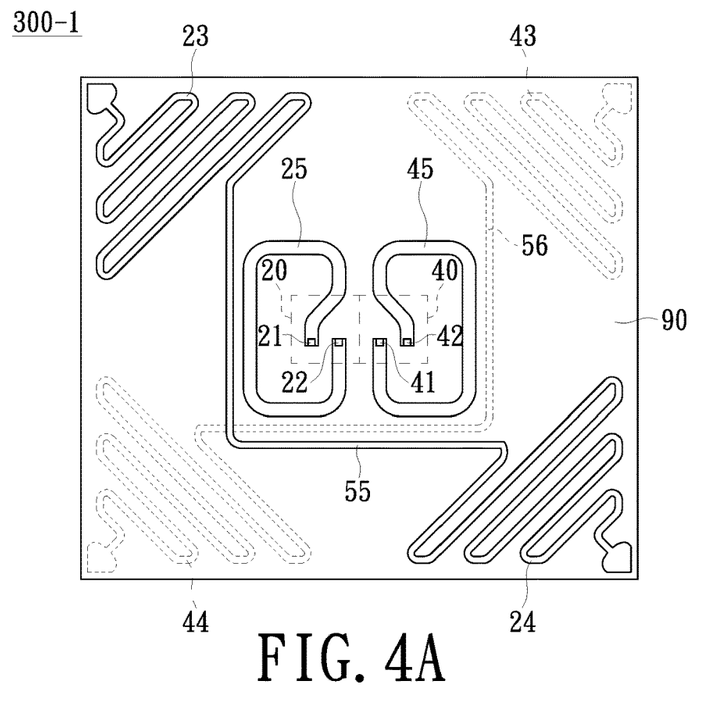
FIG. 4A is a diagram illustrating a modification based on the embodiment of FIG. 2.

Refer to FIG. 4A, which is a diagram illustrating an RF tag 300-1 according to another embodiment of the present invention, and can be considered as an alternative design of the aforementioned RF tag 100. As shown in FIG. 4A, the RFID tag 300-1 comprises a sheet 90, a first RF chip 20 and a second RF chip 40, a wiring segment 25 and a second wiring 45. The sheet 90 functions as the platform or a substrate of the above elements. The first RF chip 20 and the second RF chip 40 are adjacent and connected to each other. The first RF chip 20 comprises pads 21 and 22, the second RF chip 40 comprises pads 41 and 42. The wiring segment 55 is wirelessly connected to one of the complementary antennas, and more particularly, is used to couple the pads 21 and 22 of the first RF chip 20 to one antenna in an approximate manner. Similarly, the wiring segment 56 is wirelessly connected to one of the complementary antennas, and more particularly, is used to couple the pads 41 and 42 of the second RF chip 40 to the other antenna in approximate manner. Please note that the wiring 56 and the wiring segments 43 and 44 in this embodiment are arranged on the flip side (e.g. the back side) of the sheet 90, while the wiring 55 and the wiring segments 23 and 24 are arranged on the front side of the sheet 90. Through the above arrangement, the wiring segment 55 will not short with and the wiring segment 56, and thus the isolating sticker is not needed in this embodiment.

The major difference between the RF tag 300-1 and the RF tag 100 is that in the RF tag 300-1, the wiring segment 25 and the second wiring 45 are not directly connected to the antennas, but are still able to transmit signals via the wireless coupling achieved using the wiring segments 55 and 56 which are proximity wirings.

In addition, the first RF 20 chip and the second RF chip 40 of the RF tag 300-1 may have the same product code, so that the two RF chips can function as a single 4-pad RF chip, and generate an omnidirectional radiation pattern without a null.

In the design of the RFID tag 300-, the two antennas should both operate under the same frequency range, e.g. UHF. Although the present invention focuses on the utilization under UHF, the overall concept may be also applicable to other frequency range, e.g. HF.

The RF tag 300-1 shown in FIG. 4A is classified as the aforementioned Type P, where the first RF chip 20 and the second RF chip 40 are horizontally connected to each other, and the pads 21 and 22 of the first RF chip 20 and the pads 41 and 42 of the second RF chip 40 form a 1×4 array. Note that in some modifications of this embodiment, the four pads 21, 22, 41 and 42 might not strictly be arranged as a linear pattern as shown in FIG. 4A. For example, the pads 21, 22, 41 and 42 may be arranged in any known or unexpected geometric patterns. Please note that the pattern and/or size of the wiring segment 25 and the second wiring 45 are not particularly limited in the RF tag 300-1, as long as the wiring segment 25 is connected to both the pads 21 and 22, and the second wiring 45 is connected to the pads 41 and 42.

Figure 4B:
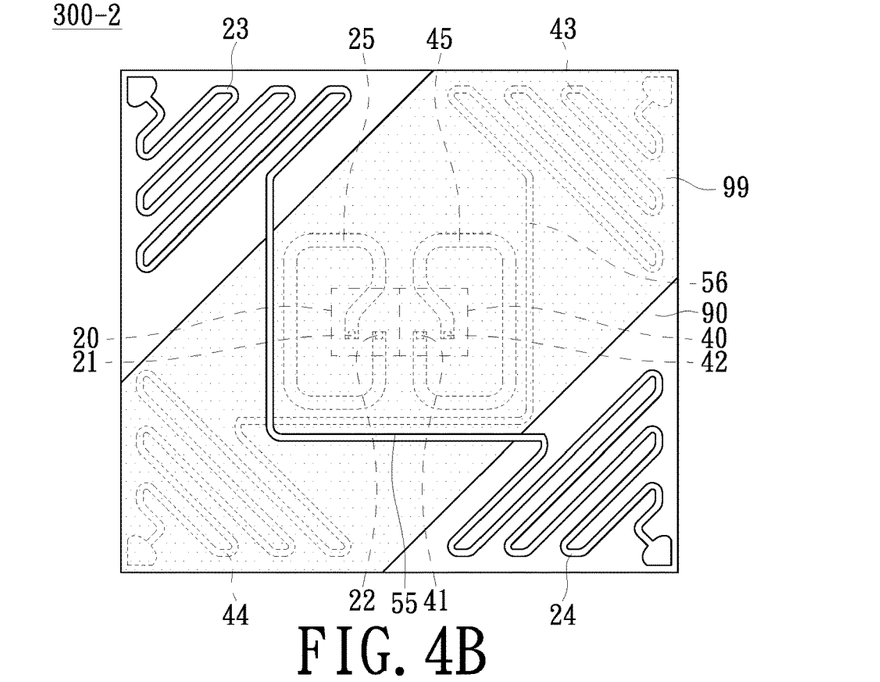
FIG. 4B is a diagram illustrating another modification based on the embodiment of FIG. 2.

Please refer to FIG. 4B, which is an alternative design of the embodiment shown in FIG. 4A. As shown in FIG. 4B, all components are now arranged on the same side (e.g. the front side) of the RF tag 300-2. In order to isolate the wiring segments 55 and 56, an isolation sticker 99 is provided between the wiring segments 55 and 56. For example, the altitude of the wiring segment 55 can be designed higher than that of the wiring segment 56, or the other way around (the altitude of the wiring segment 56 can be designed higher than that of the wiring segment 55). As the rest implementation details can be fully understood from previous embodiments, they are omitted here for brevity.

Figure 4C:
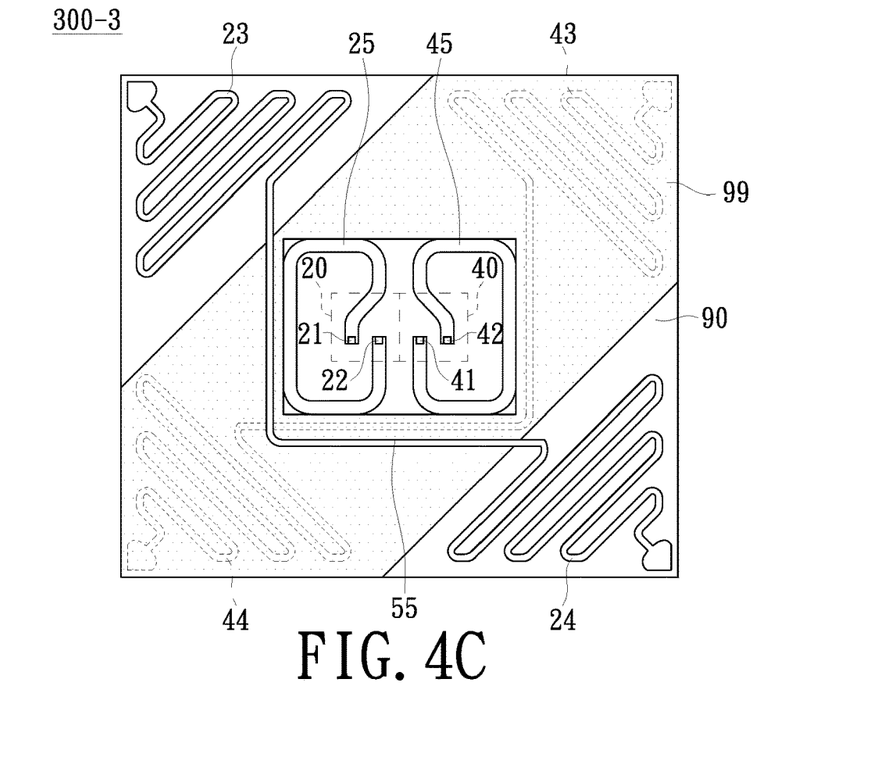
FIG. 4C is a diagram illustrating yet another modification based on the embodiment of FIG. 2.

Please refer to FIG. 4C, which is an alternative design of the embodiment shown in FIG. 4A. As shown in FIG. 4C, all components are now arranged on the same side (e.g. the front side) of the RF tag 300-3. The main difference from the RF tag 300-2 is that the RF tag 300-3 further hollows out a middle part of the isolation sticker 99 that hovers the square region including the wirings segments 25 and 45. This modification will not compromise the effect of isolating the wiring segments 55 and 56, but may provide better cooling effects as well as less shielding effects for the chip. As the rest implementation details can be fully understood from previous embodiments, they are omitted here for brevity.

Refer to FIG. 5A, which is a diagram illustrating an RF tag 400-1 according to another embodiment of the present invention, and can be considered as an alternative design of the aforementioned RF tag 200. As shown in FIG. 5A, the difference between the RF tag 300-1 and the RF tag 400-1 is that the RF tag 400-1 is classified as the aforementioned Type V, where the first RF chip 60 and the second RF chip 80 are vertically connected to each other (although the connection between the first RF chip 60 and the second RF chip 80 appears to be horizontal, the vertical connection can be easier to tell by rotating FIG. 3 for 90 degrees). The pads 61 and 62 of the first RF chip 60 and the pads 81 and 82 of the second RF chip 80 form a 2×2 matrix. In this embodiment, the wiring 56 and the wiring segments 43 and 44 in this embodiment are arranged on the flip side (e.g. the back side) of the sheet 90, while the wiring 55 and the wiring segments 23 and 24 are arranged on the front side of the sheet 90. Through the above arrangement, the wiring segment 55 will not short with and the wiring segment 56, and thus the isolating sticker is not needed in this embodiment. Note that in some modifications of this embodiment, the four pads 61, 62, 81 and 82 might not strictly be arranged as a square pattern as shown in FIG. 5A. For example, the pads 61, 62, 81 and 82 may be arranged in any known or unexpected geometric pattern.

The major difference between the RF tag 400-1 and the RF tag 200 is that in the RF tag 400-1, the wiring segment 25 and the second wiring 45 are not directly connected to the antennas, but are still able to transmit signals via the wireless coupling achieved using the wiring segments 55 and 56 which are proximity wirings.

In addition, the first RF 20 chip and the second RF chip 40 of the RF tag 400-1 may have the same product code, so that the two RF chips can function as a single 4-pad RF chip, and generate an omnidirectional radiation pattern without a null.

In the design of RFID tag 400-1, the two antennas should both operate under the same frequency range, e.g. UHF. Although the present invention focuses on the utilization under UHF, the overall concept may be also applicable to other frequency range, e.g. HF.

Please note that the pattern and/or size of the wiring segment 25 and the second wiring 45 are not particularly limited in the RF tag 400-1, as long as the wiring segment 25 is connected to both the pads 21 and 22, and the second wiring 45 is connected to the pads 41 and 42.

Please refer to FIG. 5B, which is an alternative design of the embodiment shown in FIG. 5A. As shown in FIG. 5B, all components are now arranged on the same side (e.g. the front side) of the RF tag 400-2. In order to isolate the wiring segments 55 and 56, an isolation sticker 99 is provided between the wiring segments 55 and 56. For example, the altitude of the wiring segment 55 can be designed higher than that of the wiring segment 56, or the other way around (the altitude of the wiring segment 56 can be designed higher than that of the wiring segment 55). As the rest implementation details can be fully understood from previous embodiments, they are omitted here for brevity.

Please refer to FIG. 5C, which is an alternative design of the embodiment shown in FIG. 5A. As shown in FIG. 5C, all components are now arranged on the same side (e.g. the front side) of the RF tag 400-3. The main difference from the RF tag 400-2 is that the RF tag 400-3 further hollows out a middle part of the isolation sticker 99 that hovers the square region including the wirings segments 25 and 45. This modification will not sacrifice the effect of isolating the wiring segments 55 and 56, but may provide better cooling effects as well as less shielding effects for the chip. As the rest implementation details can be fully understood from previous embodiments, they are omitted here for brevity.

According to some embodiments of the present invention, the RFID tag provided by the present invention is a passive RFID tag suitable for high frequency (HF), specifically ultra-high frequency (UHF), such as 860 MHz-960 MHz.

To sum up, the present invention provides a "twin IC" (or Dual IC) structure, where two chips each having two pads are adjacent and connected each other. The cost of two chips with two pads, as widely known, are much cheaper than a chip with four pads. The antenna provided by the present invention can reach the desired omnidirectional radiation pattern without a null by using chips with two pads only, and is thus novel and reduces the cost by far. In addition, the twin RF chips of the RFID tag may have the same product code (EPC & TID), and two antennas of the RFID tag are complementary to each other, such that the RFID tag provided by the present invention can generate the same omnidirectional radiation pattern without a null as the technical capability of the conventional four-pad RFID tag. Comparatively, the proposed twin IC solutions not only realize the RF tags with omnidirectional radiation pattern without a null (which stand out from conventional two-pad tags), but also is cost effective over conventional four-pad RF tags.

What is claimed is:

1. A RFID tag comprising:
    a first RF chip and a second RF chip adjacent and connected to each other, wherein each of the first RF chip and the second RF chip has two pads, and said two pads of the first RF chip and said two pads of the second RF chip are connected to two complementary antennas connected, respectively;
    a first wiring conducting said two pads of the first RF chip to one of said two complementary antennas;
    a second wiring conducting said two pads of the second RF chip to the other of said two complementary antennas, wherein the first wiring crosses the second wiring in a plan view; and
    an isolation sticker disposed between the first wiring and the second wiring.

2. The RFID tag according to claim 1, wherein the first RF chip and the second RF chip generate an omnidirectional radiation pattern.

3. The RFID tag according to claim 1, wherein the RFID tag is operated under high frequency (HF) or above.

4. The RFID tag according to claim 3, wherein the RFID tag is operated under ultra-high frequency (UHF).

5. The RFID tag according to claim 1, wherein the first RF chip and the second RF chip are cut as a whole from a wafer.

6. The RFID tag according to claim 5, wherein the first RF chip and the second RF chip are arranged in a row in a first direction and connected to each other, and said two pads of the first RF chip and said two pads of the second RF chip are arranged in a row extending along the first direction in a plan view.

7. The RFID tag according to claim 5, wherein the first RF chip and the second RF chip are arranged in a row in a first direction and connected to each other, and said two pads of the first RF chip are arranged in a row extending in a second direction perpendicular to the first direction, and said two pads of the second RF chip are arranged in a row extending in the second direction in a plan view.

8. The RFID tag according to claim 1, wherein said two pads of the first RF chip are connected to two ports of one of said two complementary antennas.

9. The RFID tag according to claim 8, wherein said two pads of the second RF chip are connected to two ports of the other of said two complementary antennas.

10. A RFID tag comprising:
a sheet;
a first RF chip and a second RF chip adjacent and connected to each other, wherein each of the first RF chip and the second RF chip has two pads;
a first wiring conducting said two pads of the first RF chip;
a second wiring conducting said two pads of the second RF chip;
a first proximity wiring connected to one of two complementary antennas and approximating with the first wiring, wherein the first proximity wiring is arranged to wirelessly conduct said two pads of the first RF chip to one of said two complementary antennas; and
a second proximity wiring connected to the other one of said two complementary antennas and approximating the second wiring, wherein the second proximity wiring is arranged to wirelessly conduct said two pads of the second RF chip to the other one of the said two complementary antennas;
wherein the first proximity wiring is disposed over a first side of the sheet and extends toward a first corner of the sheet, and the second proximity wiring is disposed over a second side of the sheet opposite to the first side of the sheet and extends toward a second corner of the sheet.

11. The RFID tag according to claim 10, wherein the first RF chip and the second RF chip generate an omnidirectional radiation pattern.

12. The RFID tag according to claim 10, wherein the RFID tag is operated under high frequency (HF) or above.

13. The RFID tag according to claim 12, wherein the RFID tag is operated under ultra-high frequency (UHF).

14. The RFID tag according to claim 10, wherein the first RF chip and the second RF chip are cut as a whole from a wafer.

15. The RFID tag according to claim 14, wherein the first RF chip and the second RF chip are arranged in a row in a first direction and connected to each other, and said two pads of the first RF chip and said two pads of the second RF chip are arranged in a row extending along the first direction in a plan view.

16. The RFID tag according to claim 14, wherein the first RF chip and the second RF chip are arranged in a row in a first direction and connected to each other, and said two pads of the first RF chip and said two pads of the second RF chip are each arranged in a row extending along a second direction perpendicular to the first direction.

17. The RFID tag according to claim 10, wherein said two pads of the first RF chip are connected to two ports of one of said two complementary antennas.

18. The RFID tag according to claim 17, wherein said two pads of the second RF chip are connected to two ports of the other of said two complementary antennas.

19. The RFID tag according to claim 10, the first wiring has a first end connecting to one of said two pads of said first RF chip and a second end connecting to the other one of said two pads of said first RF chip.

20. The RFID tag according to claim 10, further comprising an isolation sticker disposed between the first proximity wiring and the second proximity wiring.

* * * * *